US012581996B2

(12) United States Patent
Spreitzer et al.

(10) Patent No.: US 12,581,996 B2
(45) Date of Patent: Mar. 17, 2026

(54) INTERPOSER INTERCONNECTS AND ENCLOSURE FOR SILICON PHOTONICS LIDAR MODULE

(71) Applicant: Intel Corporation, Santa Clara, CA (US)

(72) Inventors: Ronald L. Spreitzer, Phoenix, AZ (US); Ankur Agrawal, Chandler, AZ (US); Guiyun Bai, Chandler, AZ (US); Eleanor Patricia Paras Rabadam, Folsom, CA (US); Sanjeev Gupta, Santa Rosa, CA (US)

(73) Assignee: Intel Corporation, Santa Clara, CA (US)

( * ) Notice: Subject to any disclaimer, the term of this patent is extended or adjusted under 35 U.S.C. 154(b) by 942 days.

(21) Appl. No.: 17/553,995

(22) Filed: Dec. 17, 2021

(65) Prior Publication Data
US 2023/0197699 A1 Jun. 22, 2023

(51) Int. Cl.
| | |
|---|---|
| *H01L 25/16* | (2023.01) |
| *G01S 7/481* | (2006.01) |
| *H01L 23/00* | (2006.01) |
| *H01L 25/075* | (2006.01) |

(52) U.S. Cl.
CPC ............ *H01L 25/167* (2013.01); *G01S 7/481* (2013.01); *H01L 24/17* (2013.01); *H01L 25/0756* (2013.01); *H01L 2924/12042* (2013.01)

(58) Field of Classification Search
CPC ..... G01S 7/4818; G01S 7/481; H01L 25/167; H01L 25/0756; H01L 24/17; H01L 24/16; H01L 2924/12042; G06N 3/0675; G02B 2006/12121
See application file for complete search history.

(56) References Cited

U.S. PATENT DOCUMENTS

| | | | | |
|---|---|---|---|---|
| 11,256,029 | B2 * | 2/2022 | Kannan | .................... G02B 6/13 |
| 11,378,664 | B1 * | 7/2022 | Tang | ....................... G01S 17/32 |
| 11,860,308 | B1 * | 1/2024 | Delaney | ............... G01S 17/931 |
| 12,136,951 | B2 * | 11/2024 | Nagarajan | ............ H04B 10/614 |
| 2019/0137706 | A1 * | 5/2019 | Xie | ....................... H10H 20/853 |
| 2021/0096310 | A1 * | 4/2021 | Chang | .................... H01L 24/19 |
| 2021/0103199 | A1 * | 4/2021 | Wu | ...................... G01S 7/4818 |
| 2022/0179159 | A1 * | 6/2022 | Wu | ...................... G02B 6/4271 |
| 2022/0400548 | A1 * | 12/2022 | Gupta | ................... G01S 7/4816 |
| 2024/0272388 | A1 * | 8/2024 | Li | ........................ G02B 6/4243 |

FOREIGN PATENT DOCUMENTS

EP 3879322 A1 * 9/2021 ......... H01L 23/3128

* cited by examiner

*Primary Examiner* — Thomas A Hollweg
*Assistant Examiner* — Mary A El-Shammaa
(74) *Attorney, Agent, or Firm* — Essential Patents Group, LLP

(57) ABSTRACT
Various embodiments disclosed relate to semiconductor packaging for photonic modules in LiDAR systems. The present disclosure includes semiconductor assemblies using an organic substrate interposer surface mounted to the printed circuit board, with an electronic integrated circuit die attached to the organic substrate and a photonic integrated circuit die attached to the organic substrate, wherein the electronic integrated circuit die, and the photonic integrated circuit die are electrically coupled to each other through the organic substrate interposer.

9 Claims, 8 Drawing Sheets

100

170

160

154 154

151

152

150

142

180

140

124

122

132

130

120

114

112

110

200

210

220

230

240

250

260

600

700

INTERPOSER INTERCONNECTS AND ENCLOSURE FOR SILICON PHOTONICS LIDAR MODULE

TECHNICAL FIELD

Embodiments described herein generally relate to semi-conductor assembly architecture, and specifically to semi-conductor assemblies with silicon photonics.

BACKGROUND

Silicon photonics are a good candidate for low cost and high-performance components, such as for increasing data centric technology. But packaging silicon photonics can be challenging, and result in compatibility and integration challenges due to mode field diameter mismatch and tight alignment tolerance. It is desired to have a low cost and efficient packaging technology that address these concerns, and other technical challenges.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
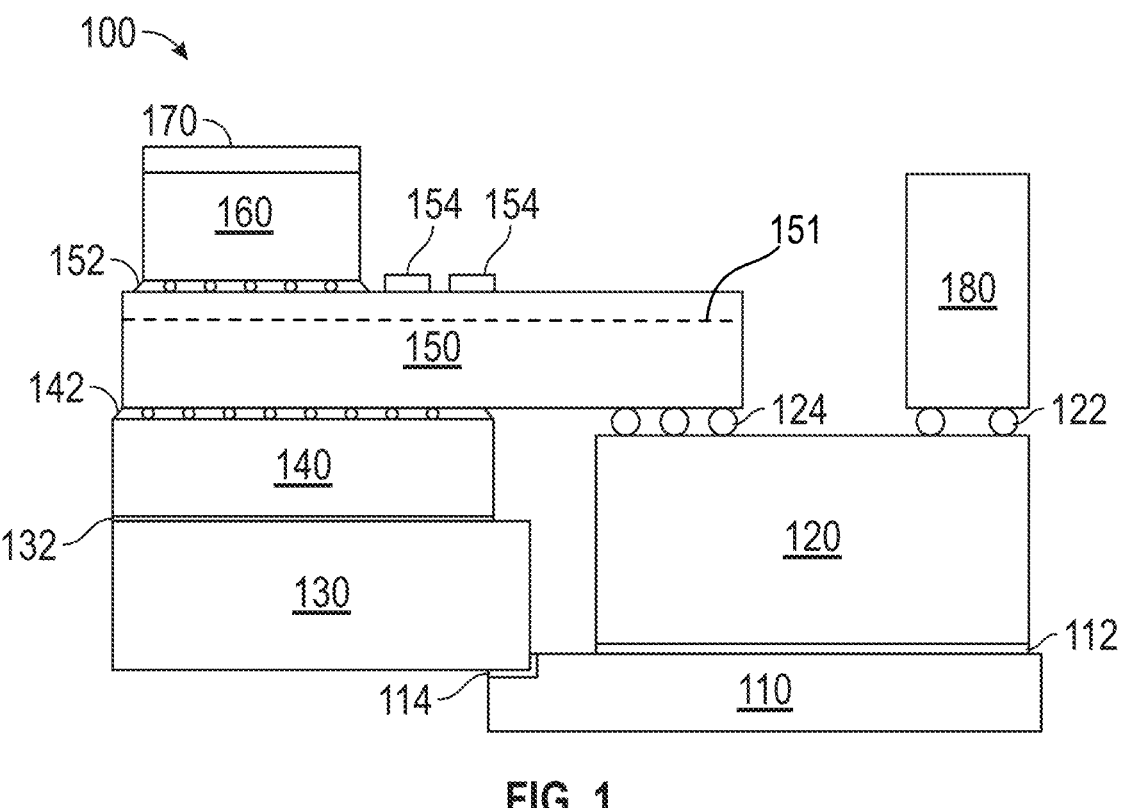
FIG. 1 depicts a schematic diagram of a PIC (photonic integrated circuit) and EIC (electrical integrated circuit) architecture for a LIDAR system using an organic substrate interposer in an example.

The following description and the drawings sufficiently illustrate specific embodiments to enable those skilled in the art to practice them, Other embodiments may incorporate structural, logical, electrical, process, and other changes. Portions and features of some embodiments may be included in, or substituted for, those of other embodiments. Embodiments set forth in the claims encompass all available equivalents of those claims.

Disclosed herein are semiconductor assemblies and method of making the same for Light Detection and Ranging (LiDAR) packaging. Here, organic substrates can be used to couple photonic integrated circuit (PIC) and electrical integrated circuit (EIC). PICs can produce or detect optical light with single or multiple frequencies. PICs can extend, enable, and increase data transmission, while consuming less power than conventional circuits. Such PICs can allow for energy efficient bandwidth scaling. PICs can allow for faster data transmission over longer distances compared to traditional electronics.

However, PIC packaging can be challenging in LiDAR systems. Fiber coupling compatibility and integration with EICs can be difficult due to mode field diameter mismatches and tight alignment tolerances.

Moreover, while PICs need to be electrically coupled to EICs in a LiDAR optical sensor system, such a system has high electrical performance requirements. Within a LIDAR system, a solid ground plane is required to reduce crosstalk between the PIC die and the EIC dies. However, where silicon is used with the PIC, the amount of metal routing layers is limited. Silicon routing constraints can hinder implementation of a ground plane to reduce crosstalk. Additionally, manufacturing techniques such as a chip on-wafer (CoW) process can prohibit the implementation of a solid ground plane as well.

In some cases, a silicon photonics module, such as including one or more PICs, needs to be electrically connected to other LiDAR system components. A separate, custom angled connecter mounted on two printed circuit boards can be used for this connection, or a rigid-flex-rigid printed circuit board and connector subsystem can be used for this connection. However, these two types of printed circuit board and connector methods often result in electrical signal integrity losses and crosstalk degradation. These methods can also rely on many pins, which can be bulky and take up significant space on the printed circuit boards. This can result in increased printed circuit board size and cost, in addition to form factor constraints within the LiDAR system.

By comparison, the interconnect and interconnect methods discussed herein, such as by leveraging organic substrates, can allow for reduced electrical performance degradation, in addition to smaller size and lower cost for such connections.

Additionally, PIC and EIC dies, and other optical components in a LiDAR system, can be encased to protect them from external environments. Discussed herein, to both encase and allow electrical connection to those components with reduced crosstalk, a flip chip process can be used to reduce signal integrity losses and crosstalk degradation that would otherwise be caused by wire-bond connections.

Several approaches to PIC electrical connection in a LiDAR system are discussed herein. In an example, an organic substrate interposer interconnect method of pho-tonic integrated circuit (PIC) to electrical integrated circuit (EIC) dies in a Light Detection and Ranging (LIDAR) system can be used. PICs and EICs need to be connected within the LIDAR system, however, to meet LIDAR performance requirements, a solid ground plane between the PIC and the EIC is often required to reduce crosstalk and meet certain crosstalk specifications. But the PIC is often limited in metal routing layers in silicon.

Thus, herein, an organic substrate is used in lieu of a metal ground plane on the PIC silicon. The organic substrate (or organic PCB) can be used to electrically connect the PIC to the EIC, such as through flip chip bumps. A solid ground plane can be included in the organic substrate to reduce crosstalk risks between the PIC and EIC.

Additionally, discussed herein is an interconnect and enclosure method for silicon photonics used in LIDAR modules. In general, silicon photonics need to be electrically connected to the LIDAR system. Conventional attachment methods with PCB can result in loss of electrical signal integrity, and crosstalk. Additionally, the components of the LIDAR system need to be encased in an enclosure to protect them from the environment.

Here, a new interposer technique is used to electrically connect the photonics LIDAR module to the LIDAR system board and components. The Interposer can be made of PCB based materials. The method uses flip chip technology to attach the PIC and EIC to an organic substrate, along with a metal shroud to attach the photonics enclosure to the LIDAR system board.

These architectures and methods can allow for a LiDAR system to meet the electrical performance requirements and Crosstalk specifications, by providing a continuous ground plane from the Photonic IC to the EICs, and to a system connector. An organic substrate interposer can provide a dual thermal path that helps remove heat generated by the PIC and the EICs, thru both the top and the bottom of the Photonic LiDAR module. A heat spreader can be attached to the top of the EICs to dissipate heat.

Connection of a photonics module by the methods and interconnects discussed herein can help eliminate cumbersome connectors and help reduce crosstalk. Thermal performance can additionally be improved, such as through dual heat paths from the PIC and EIC components. The module enclosure size can be reduced by efficiently utilizing both sides of an Organic Substrate surface area.

In an example, a semiconductor assembly can include a printed circuit board, an organic substrate interposer surface mounted to the printed circuit board, the organic substrate interposer having a first side and a second side opposite each other, an electrical integrated circuit die attached to the organic substrate on the first side, and a photonic integrated circuit die attached to the organic substrate on the second side, wherein the electrical integrated circuit die and the photonic integrated circuit die are electrically coupled to each other through the organic substrate interposer.

In an example, a method of making a semiconductor assembly can include attaching a photonic integrated circuit die to a first side of an organic substrate interposer, attaching an electrical integrated circuit die to a second side of the organic substrate interposer, wherein the second side is opposite the first side, surface mounting the organic substrate interposer to a printed circuit board, and attaching photonic integrated circuit die to a a insert.

In an example, semiconductor assembly can include a system board, an interconnect array interposer, an organic substrate comprising a flip chip land grid array (FCLGA), an electrical integrated circuit die electrically coupled to the system board through the organic substrate and the interconnect array interposer, a photonics module comprising one or more photonic integrated circuits (PICs), wherein the organic substrate and the interconnect array interposer electrically couple the photonics module to the system board, an optical bench configured to allow optical connection to the photonics module, and a shroud at least partially enclosing the interposer, the organic substrate, and the photonics module.

In an example, a method of making a semiconductor assembly can include attaching a photonics integrated circuit die and an electrical integrated circuit die to an organic substrate, surface mounting a pin array interposer to the organic substrate opposite the photonics module, securing the photonics integrated circuit die, the electrical integrated circuit die, and the pin array interposer to an optical bench, and attaching a system board to the pin array interposer opposite the organic substrate.

Figure 2:
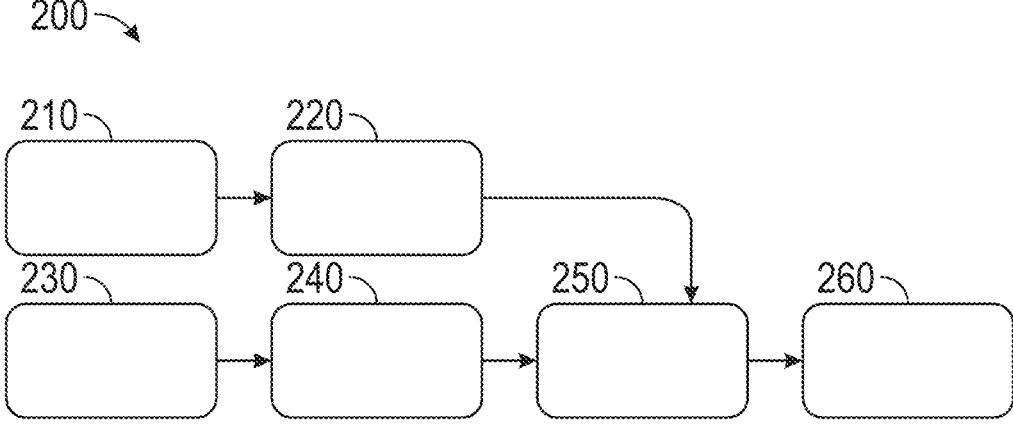
FIG. 2 depicts a flow chart illustrating a method of making a PIC and EIC architecture with an organic substrate interposer in an example.
Figure 3:
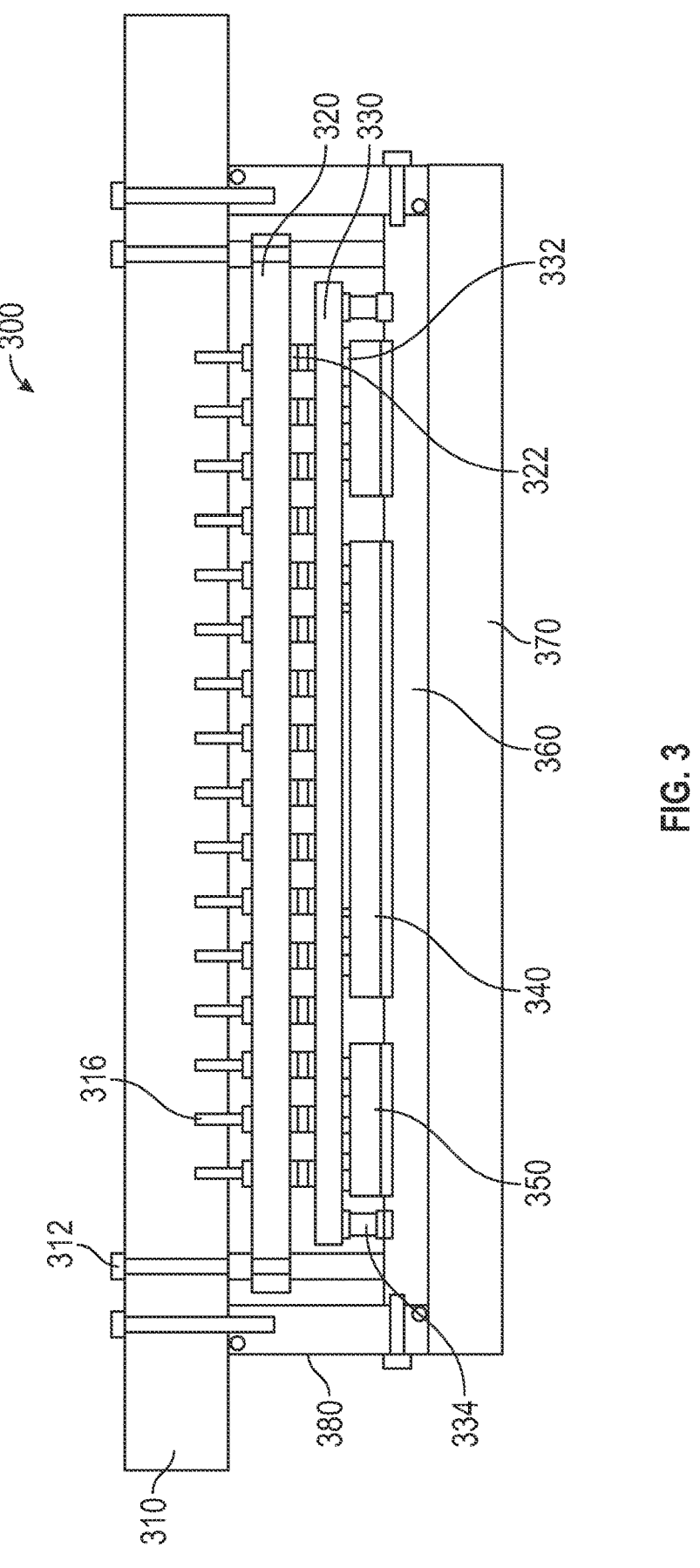
FIG. 3 depicts a schematic of a PIC and EEC interconnect architecture using an organic substrate interposer in an example.

FIGS. 1-3 discuss examples of semiconductor assemblies and methods using an organic substrate interposer to connect a PIC with other EICs in a LiDAR system. Such an organic substrate interposer can help improve electrical interconnect within the LiDAR enclosure by eliminating wire-bond connections between the PIC and EICs.

FIG. 1 depicts a schematic diagram of a PIC and EIC architecture for a LIDAR system using an organic substrate interposer in an example. The semiconductor assembly 100 can include a chassis 110, a printed circuit board 120, an insert 130, a photonic integrated circuit die 140, an organic substrate interposer 150, an electrical integrated circuit die 160, a heat spreader 170, and a system connector 180.

In the semiconductor assembly 100, the printed circuit board 120 can be mounted on the chassis 110 by a connection layer 112. Similarly, a portion of the insert 130 can be mounted on the chassis 110 with a connection layer 114. The connection layer 112 and connection layer 114 can be, for example, an adhesive or other filler material. The system connector 180 can be attached to the printed circuit board 120 opposite the chassis 110, such as by a ball grid array 122.

In assembly 100, the photonic integrated circuit die 140 and the electrical integrated circuit die 160 can be attached to opposing sides of the organic substrate interposer 150. The photonic integrated circuit die 140 can be secured to the insert 130 such as by a connection layer 132. The organic substrate interposer 150 can be attached between the photonic integrated circuit die 140 and the electrical integrated circuit die 160 by connection layer 142 and connection layer 152. The connection layer 142 and connection layer 152 can, for example, be made of solder balls and an underfill. The heat spreader 170 can be situated on the electrical integrated circuit die 160.

In the assembly 100, the photonic integrated circuit die 140 and the electrical integrated circuit die 160 can be attached on both sides of the organic substrate interposer 150 through flip chip and underfill assembly to create an electrical connection between the photonic integrated circuit die 140 and electrical integrated circuit die 160. In assembly 100, the organic substrate interposer 150 comprises a ground plane 151 and can be surface mounted to the printed circuit board 120 that is attached to the chassis 110. This can help create the electrical connection between the photonic integrated circuit die 140 and the electrical integrated circuit die 160.

The chassis 110 can be a housing or the supporting frame of a structure for the LiDAR system or semiconductor assembly 100. The other components can be mounted on the chassis 110, such as by underfill or other connectors. In some cases, the chassis 110 can be a car chassis. In this case, the LiDAR system can potentially be used for automated driving, such as with artificial intelligence, blind spot detection, or other uses.

The printed circuit board 120 can be a laminated sandwich structure of conductive and insulating layers, such as for connection of various electrical components in the LiDAR system. The printed circuit board 120 can be for both affixing components within the system and for creating electrical connections.

The insert 130 can be a high thermal conductivity material, such as ceramic, and can be used to enable a direct thermal path from the photonic IC to a system thermal solution. The insert can be a high thermal conductivity material, such as a ceramic insert. The spacing insert 130 can be a ceramic spacing component, such as can be used for situating the photonic integrated circuit die 140 above the chassis 110 separate from the printed circuit board 120. The spacing insert 130 can be sized, shaped, or arranged to physically locate the photonic integrated circuit die 140, the organic substrate interposer 150, and the electrical integrated circuit die 160 where desired within the semiconductor assembly 100.

The photonic integrated circuit die 140 can be configured to produce and receive multiple optical signals, such as in the visible or infrared (IR) spectrum. The photonic integrated circuit die 140 can include single or multiple optical ports where optical signals exit the photonic integrated circuit die 140 for use elsewhere in the LiDAR system.

The organic substrate interposer 150 can be an interposer or interconnect for electrically coupling the photonic integrated circuit die 140 to the electrical integrated circuit die 160, The organic substrate interposer 150 can be, for example, an organic material such as a heat resistant and high-strength thermoset resin. In some cases, this resin can include a bismaleimide triazine resin.

The electrical integrated circuit die 160 can include an integrated circuit, such as a silicon material with layers of MOSFETS integrated into a chip. The electrical integrated circuit die 160 can be a faster, smaller, and less expensive construction compared to discrete components.

The heat spreader 170 can be situated on the electrical integrated circuit die 160 to allow for dissipation of thermal energy in the semiconductor assembly 100. The heat spreader 170 can transfer energy as heat from a hotter source, such as the electrical integrated circuit die 160 to a colder heat sink or heat exchanger.

The system connector ISO can allow for electrical connection of the semiconductor assembly 100 to the rest of the LiDAR system. The system connector ISO can be electrically connected to the photonic integrated circuit die 140 and the electrical integrated circuit die 160 through the printed circuit board 120 and the organic substrate interposer 150.

FIG. 2 depicts a flow chart illustrating a method 200 of making the semiconductor assembly 100 of FIG. 1. In method 200, two portions of the assembly can be prepared simultaneously if desired, then combined.

At block 210, a PIC die can be attached to an organic substrate interposer. At block 220, an DC die can be attached to the organic substrate interposer on a surface opposite the PIC die. Each of the PIC and EIC can be attached, for example, through a flip chip and underfill assembly. Flip chip methods can, for example, include a method for interconnecting dies to external circuitry with solder bumps that have been deposited onto chip pads. In an example flip chip method, the PIC or EIC die can be created, such as on a wafer. Pads can be metallized on the surface of the PIC or EIC die. Solder balls can be deposited on each of the metallized pads, such as by wafer humping. The PIC or EIC die can be cut from the wafer and flipped so that the solder balls face connectors on external circuitry, such as on the organic substrate interposer. The solder balls can then be remelted, such as with hot air reflow. The mounted PIC or EIC die can be underfilled (e.g., with a capillary effect) such as with an electrically insulating adhesive. This can allow the electrical connection between the PIC and the EIC dice.

Either simultaneously or in sequence, a system connector for coupling the assembly to the rest of a LiDAR system can be coupled to a printed circuit board (block 230). The printed circuit board can likewise be attached to a chassis (block 240).

At block 250, the PIC can be attached to aninsert. The organic substrate interposer can also be surface mounted to the printed circuit board (e.g., where the organic substrate interposer is mounted directly onto the surface of the printed circuit board). This can enable an electrical connection between the PIC die and the rest of the LiDAR system components, through the system connector mounted on the printed circuit board.

Optionally, at block 260, a heat spreader can be mounted to the EIC die opposite the organic substrate, such as to aid in thermal management of the assembly.

FIGS. 3-10 below discuss semiconductor assemblies, architectures, and methods for LiDAR system including a photonics module (such as include one or more PIC dice). Discussed are methods and assemblies for electrically connecting the PIC die to a LiDAR system board and other components.

Here, an interposer made of FR4 based printed circuit board material can be used. FR4 is a glass-reinforced epoxy laminate material. This FR4 interposer can be used in combination with an organic substrate, such as a Flip Chip Land Grid Array (FCLGA) substrate. This type of flip chip technology can aid in electrically connecting PIC dice and other EIC dice to the organic substrate.

Additionally, a metal shroud can be used for direct attachment of the die to the LiDAR system board. Such an enclosure can help protect the PIC dice, EIC dice, and other optical components.

FIG. 3 depicts a schematic of a PIC and interconnect architecture in a LiDAR SYSTEM using an organic substrate and an FR4 interposer, in an example. The assembly 300 can include a system board 310, an interconnect array interposer 320, an organic substrate 330, a PIC die 340, EIC dice 350, an optical bench 360, a cold plate 370, and a shroud 380. The assembly 300 can be electrically interconnected by pins 316, interconnects 322, and bumps 332. The passive components 334 can be surface mounted on the organic substrate 330 and attached to the optical bench 360 via adhesive. The pins 312 can be used to mechanically connect the optical bench 360 to the interconnect array interposer 320 and the system board 310.

The system board 310 can be, for example, a printed circuit board (PCB) suitable for hosting and connecting various components of the LiDAR system. The pins 312 can include one or more mechanical features for securing the system board 310 in place within the assembly 300.

The interconnect array interposer 320 can be, for example, an FR4 interposer within the assembly 300. FR4 is a composite material including woven fiberglass cloth with an epoxy resin binder that is flame resistant. The interconnect array interposer 320 can help reduce additional connectors typically required for electrically coupling the PIC die 340 to the system board 310.

Such an FR4 interconnect array interposer 320 is relatively inexpensive. Additionally, electrical performance loss can be minimized through the FR4 interconnect array interposer 320. The interconnect array interposer 320 can be reworkable, allowing easier replacement of PIC die 340 when desired.

The surface mount interconnects 322 can couple the interconnect array interposer 320 to the organic substrate 330. The organic substrate 330 can be an organic substrate interposer. The organic substrate 330 can be a flip chip land grid array. A typical land grid array can be a surface-mount packaging for integrated circuits that is notable for having the pins on the socket rather than the integrated circuit. In this case, the organic substrate 330 can be made with a flip chip and underfill method as discussed above.

Accordingly, the flip chip bumps 332 on the underside of the Organic substrate 330 can electrically connect to both the PIC die 340 and the EIC dice 350.

The PIC die 340 can include one or more PIC dice for use within the LiDAR system. The PIC die 340 can work in conjunction with the optical bench 360 to provide one or more optical signals within the LiDAR system, such as in the visible spectrum or near infrared, in about the range of 850 nm-1650 nm in wavelength. The optical bench 360 can contain an inlet for optical connection of the PIC die 340 such as by a fiber optic cable, and an outlet for optical signals, such as with a prism or waveguide.

The EIC dice 350 can be a variety of types of EICs, such as Transimpedance Amplifiers (TIA). A TIA is a current to voltage converter, such as can be used to amplify current output of the PIC die 340.

The cold plate 370 can be a heat dissipating or heat spreading component to aid in thermal management and cooling of the assembly 300.

The shroud 380 can be a metallic shroud for encasing the assembly 300 including the PIC die 340 and protecting the various components of the assembly 300. The shroud 380 can help directly, mechanically secure the PIC die 340 to the system board 310.

Overall, in the assembly 300, the PIC die 340 and EIC dice 350 can be attached on the same side of the organic substrate 330 through a flip chip assembly process. The interconnect array interposer 320 can electrically connect the PIC die 340 to the system board 310. The shroud 380 can help secure the PIC die 340 to that system board 310.

Figure 4A:
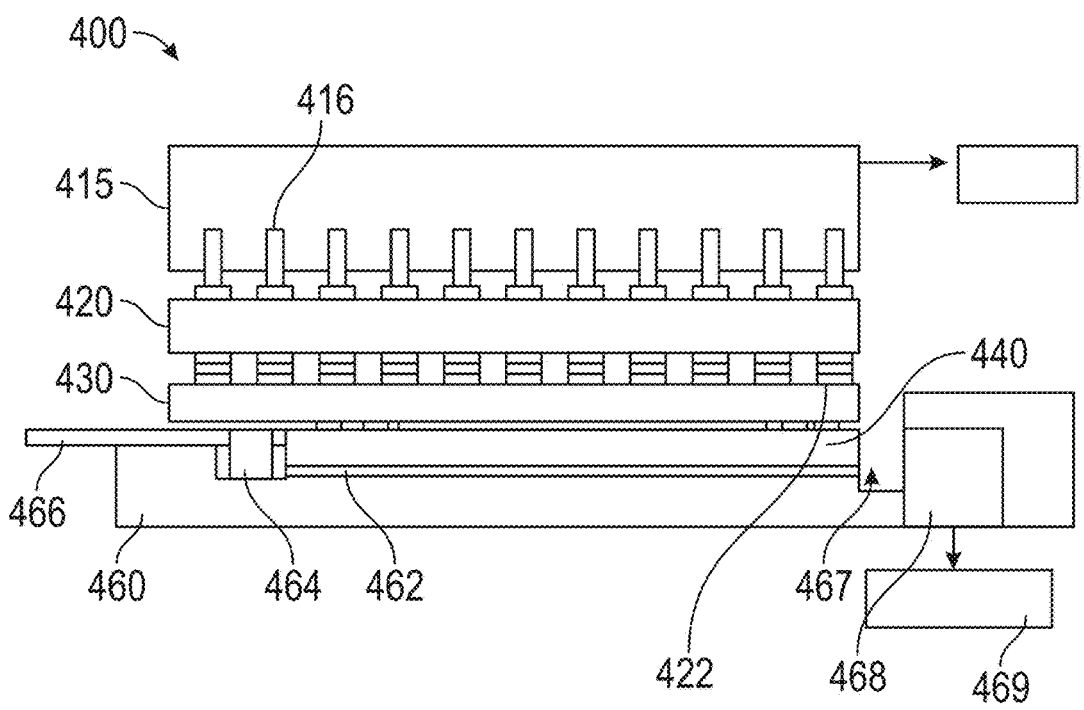
FIGS. 4A-4B depict schematics of a PIC and EIC inter-connect architecture using an organic substrate interposer in an example.
Figure 4B:
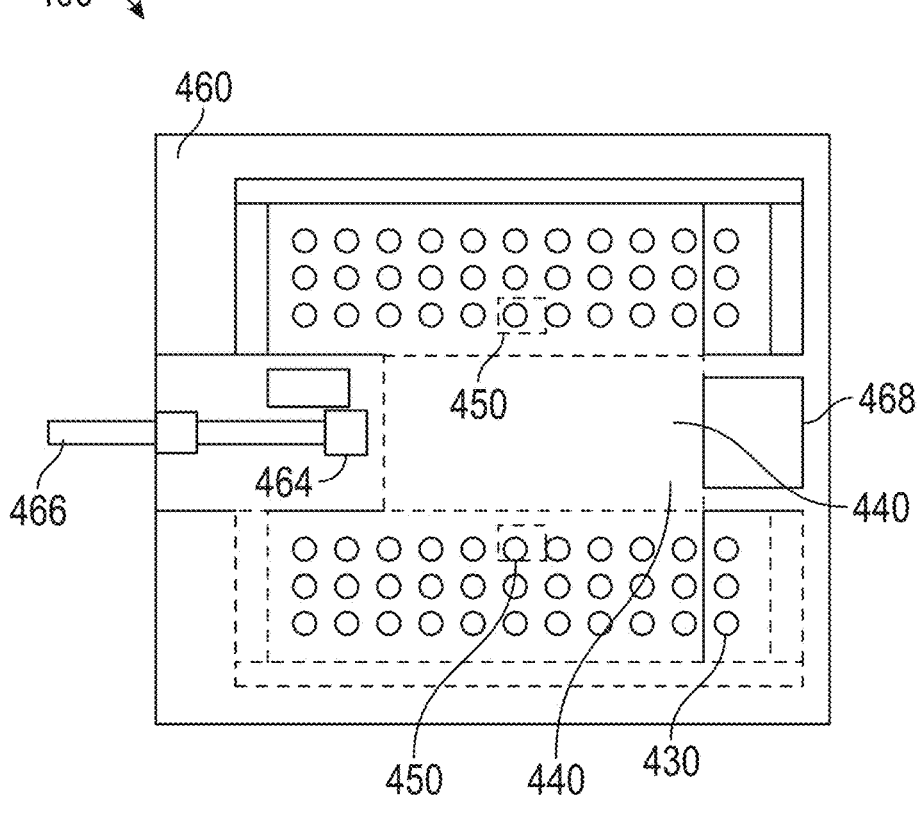

FIGS. 4A-4B depict schematics of a PIC and EIC interconnect architecture using an organic substrate and an FR4 interposer in an example. The assembly 400 can include a test board 415, pins 416, interconnect array interposer 420, surface mount interconnects 422, an organic substrate 430, a flip chip bump array 432, a PIC die 440, an optical bench 460, a connection layer 462, an inlet 464, fiber array unit 466, an outlet 467, a prism 468, and a lens 469. FIG. 4A depicts a side view, while FIG. 4B depicts a top-down view.

The assembly 400 is similar to assembly 300 and contains similar components. However, the assembly 400 does not include a system board, and instead is secured to an FR4 test board 415. The test board 415 can be used to test alignment of the PIC die 440 and to ensure both electrical and optical coupling within assembly 400.

The optical bench 460 can be attached to the PIC die 440 by the connection layer 462, such as an adhesive. The optical bench 460 can include the inlet 464 for connection of the PIC die 440 to the fiber array unit 466, such as to allow for optical connection. The optical bench 460 can additionally include the outlet 467, for output of optical signals from the PIC die 440. In some cases, the outlet 467 can include a prism 468 and a lens 469 for manipulation of an optical signal outputted by PIC die 440. In some cases, a waveguide or other component can be used in the outlet 467.

In assembly 400, a cutout in the organic substrate 430 can enable active optical alignment of the fiber array unit 466 to the PIC die 440. The interconnect array interposer 420 can be electrically attached to the test board 415 on an Optical Assembly tool, to enable this active alignment.

Figures 5, 6A:
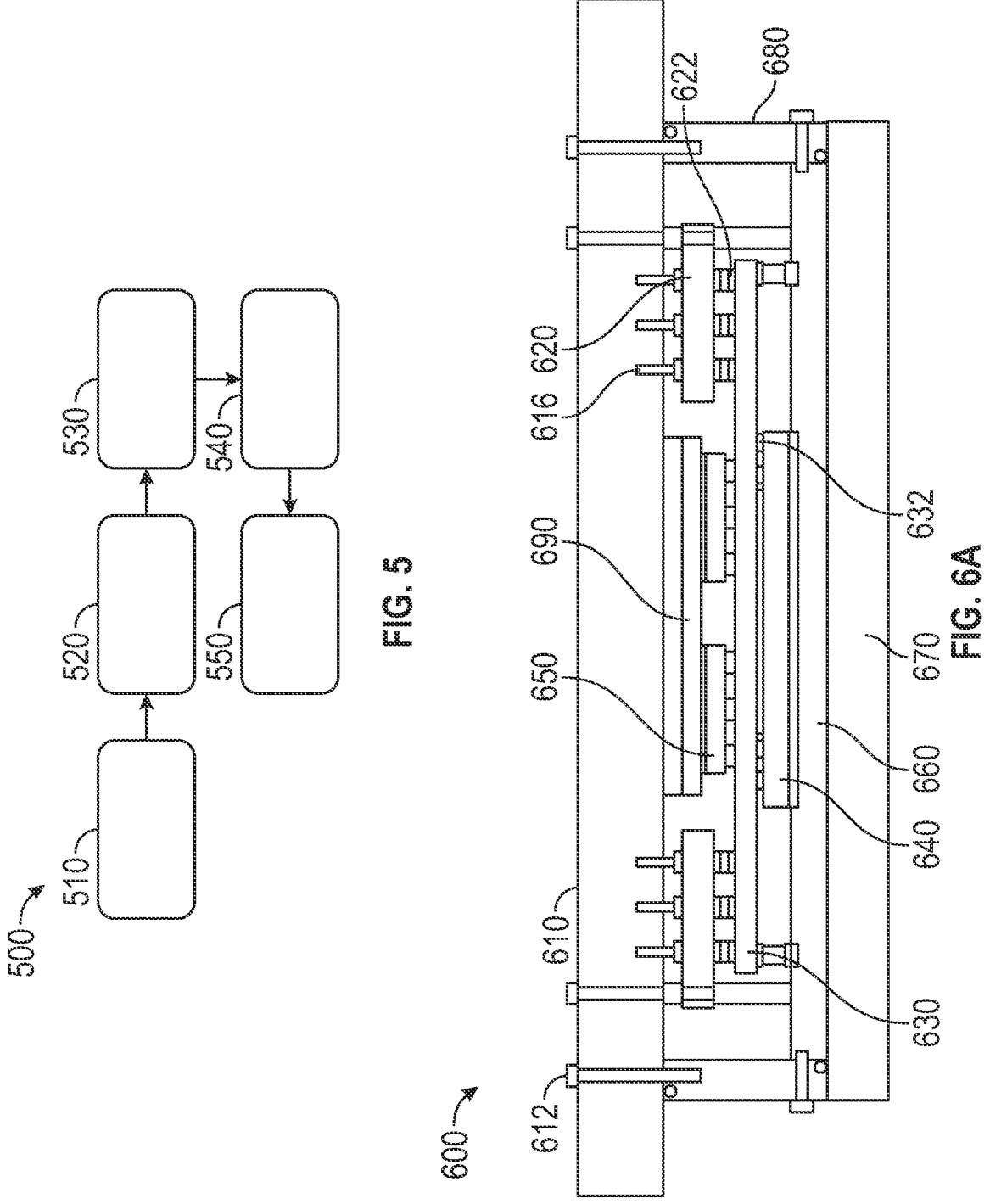
FIG. 5 depicts a flow chart illustrating a method of making a PIC and EIC architecture with an organic substrate interposer in an example.
FIGS. 6A-6B depict schematics of a PIC and EIC inter-connect architecture using an organic substrate interposer in an example.

FIG. 5 depicts a flow chart illustrating a method 500 of making a PIC and EIC architecture with an organic substrate and an FR4 interposer, such as those discussed above with reference to FIGS. 3 to 4B, in an example.

In method 500, the PIC die, and EIC dice can be attached on the same side of the organic substrate (e.g., FCLGA substrate) through a flip chip process as discussed above (block 510). The interconnect array interposer (e.g., FR4) can be surface mounted to the organic substrate on a side opposite the PIC die and EIC (block 520).

The organic substrate with attached PIC die, EIC dice, and interconnect array interposer can be attached to an optical bench (which can serve as a chassis) (block 530). A fiber array unit can then be attached within the optical bench and aligned as discussed with reference to FIGS. 4A-4B, such as with a test board (block 540). In some cases, a heat spreader can be attached to the EIC dice, such as to allow a second thermal path to the top of the assembly.

Finally, the whole assembly can be attached to the LiDAR system board such as mechanically by a metallic shroud (block 550).

Figure 6B:
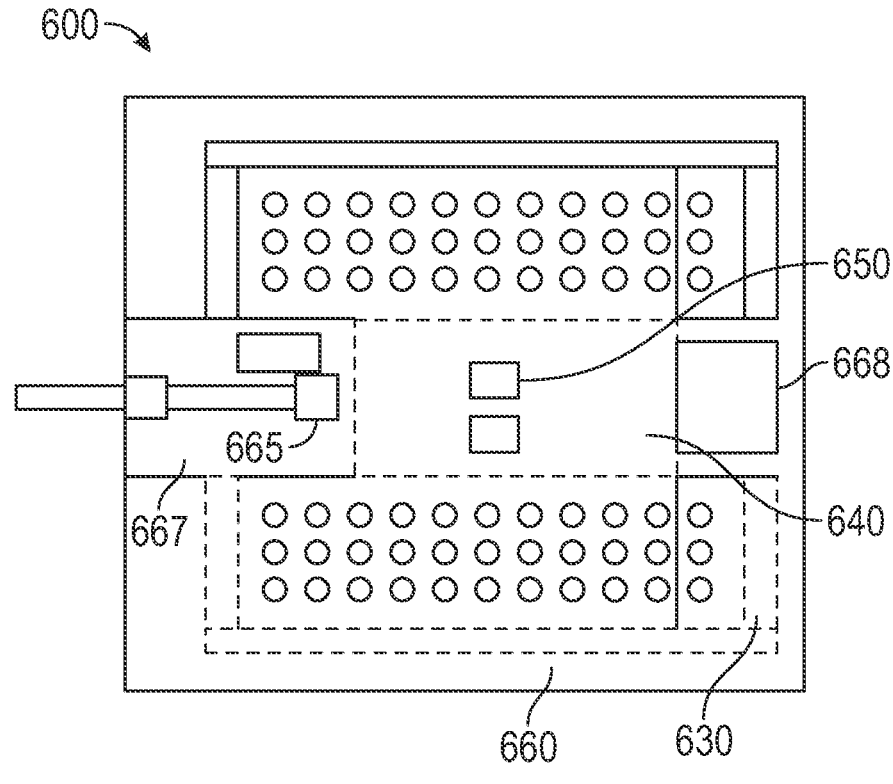

FIGS. 6A-6B depict schematics of a PIC and ETC interconnect architecture using an organic substrate and an FR4 interposer in an example. FIG. 6A depicts a side view, while FIG. 6B depicts a top-down view.

The assembly 600 can include a system board 610, pins 612, pins 616, a ring interconnect array interposer 620, interconnections 622, an organic substrate 630, a flip chip bump array 632, supports 634, a PIC die 640, EIC dice 650, an optical bench 660 with inlet 664, fiber array unit 665, outlet 667, prism 668, a cold plate 670, and a shroud 680. The assembly 600 can additionally include a heat spreader 690.

In the assembly 600, the PIC die 640 and the ETC dice 650 can be attached on opposing side of the organic substrate 630, such as by using a flip chip assembly process. The ring interconnect array interposer 620 can be a ring-shaped interposer, such as having space in a central portion where other components can be mounted. The ring interconnect array interposer 620 can be attached at the edges of the organic substrate 630.

Both the ring interconnect array interposer 620 and the organic substrate 630 can be electrically connecting the PIC die 640 to the system board 610. The heat spreader 690 can be included to dissipate heat from the EIC dice 650 in a central portion of the assembly 600. A metallic shroud 680 can be used to mechanically secure the PIC die 640 to the system board 610.

Figure 7:
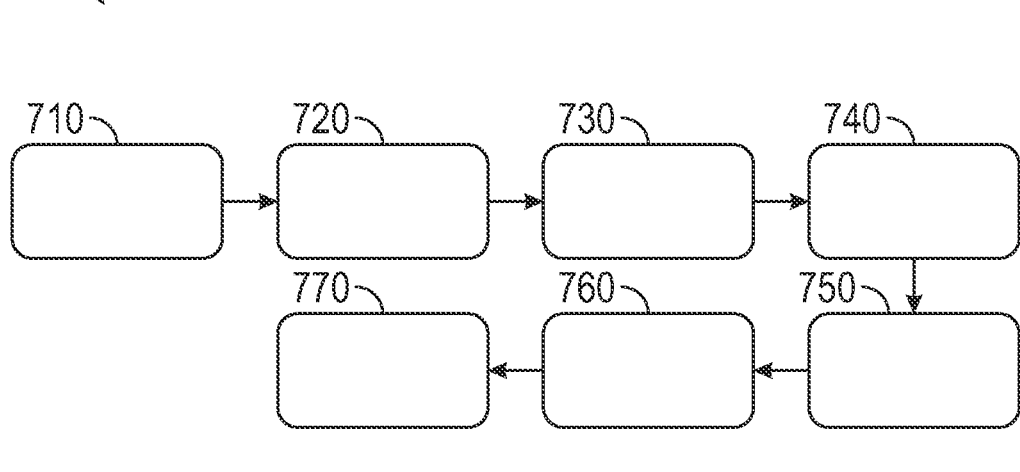
FIG. 7 depicts a flow chart illustrating a method of making a PIC and EIC architecture with an organic substrate interposer in an example.

FIG. 7 depicts a flow chart illustrating a method 700 of making a PIC and EIC architecture with an organic substrate and a ring interconnect array interposer, such as the example discussed with reference to FIGS. 6A-6B, in an example.

In method 700, the PIC die (e.g., including at least one PIC die) and the EIC dice can be attached on opposing side of the organic substrate through a flip chip process (block 710, block 720). The ring interconnect array interposer (e.g., FR4 interposer) can be surface mounted to the organic substrate (block 730). Subsequently, the organic substrate with the PIC die, EIC dice, and a ring interconnect array interposer can be mechanically attached to the optical bench (which can act as a chassis) (block 740).

A fiber array unit can be attached to the optical bench, and the PIC die can be aligned (block 750). A heat spreader can be attached to the ETC dice (block 760). The assembly can then be connected to a LiDAR system board through a shroud, such as a metallic shroud (block 770).

Figure 8:
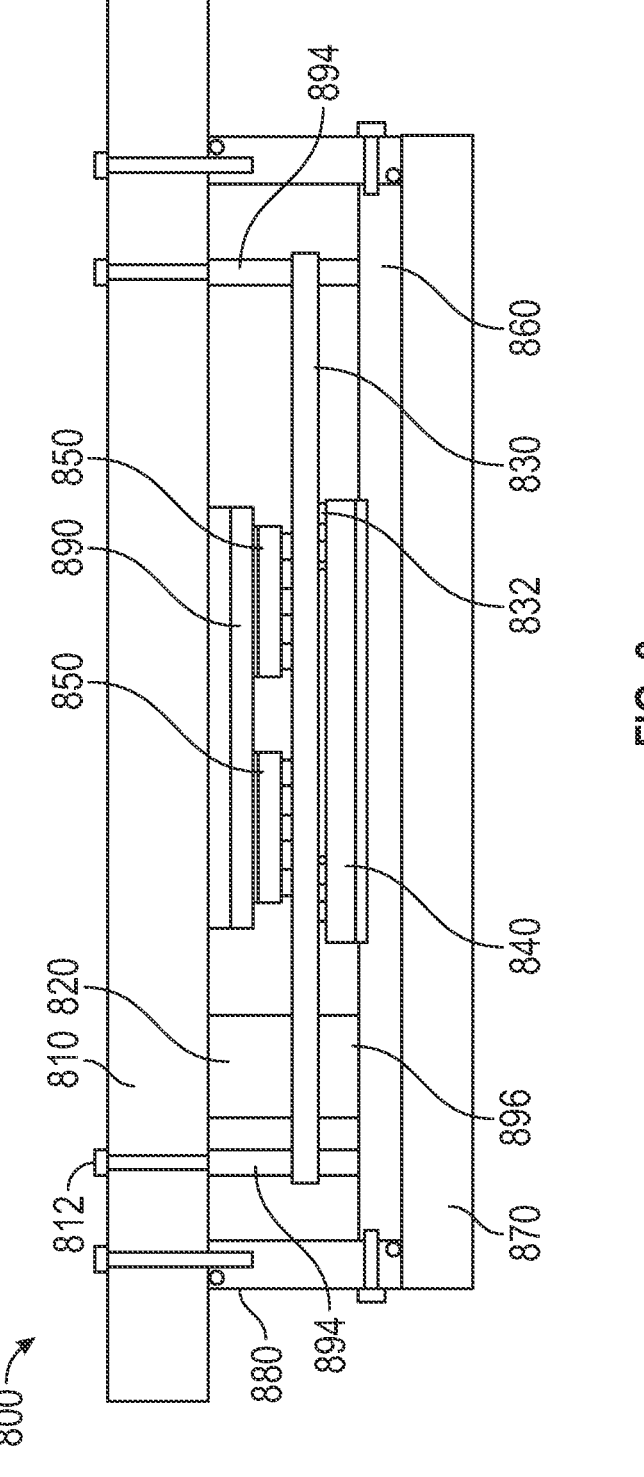
FIG. 8 depicts a schematic of a PIC and EIC interconnect architecture using an organic substrate interposer in an example.

FIG. 8 depicts a schematic of a PIC and EIC interconnect architecture using an organic substrate in an example. The assembly 800 can include a system board 810, pins 812, a first flip chip bump array 816, a connector 820, an organic substrate 830, a second flip chip bump array 832, a PIC die 840, EIC dice 850, an optical bench 860, a cold plate 870, a shroud 880, and a heat spreader 890. The assembly 800 can additionally include standoffs 894 and supports 896.

In assembly 800, the PIC die 840 and the EIC dice 850 can be attached to opposing side of the organic substrate 830, such as through a flip chip assembly process.

In assembly 800, the connector 820 is attached to both the organic substrate 830 and the system board 810 to provide electrical connection between the PIC die 840 and the system board 810. The standoffs 894 and supports 896 can help mechanically uphold the connector 820 and the assembly 800, along with the shroud 880.

Figure 9:
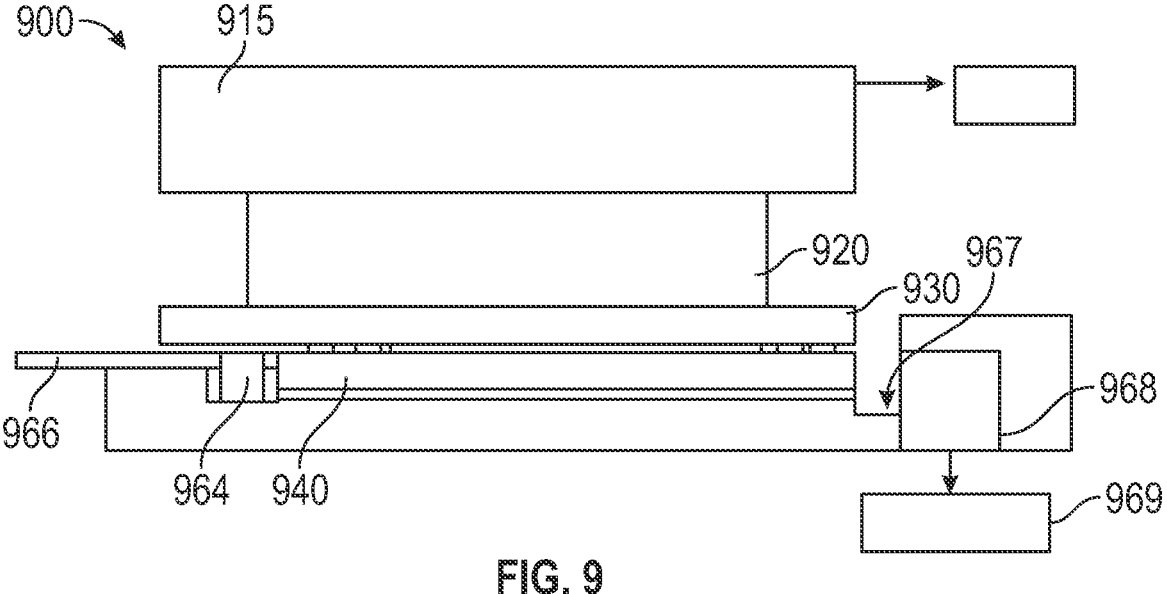
FIG. 9 depicts a schematic of a PIC and EIC interconnect architecture using an organic substrate interposer in an example.

FIG. 9 depicts a schematic of a PIC and EIC interconnect architecture using an organic substrate interposer in an example. The assembly 900 can include a test board 915 with tester connection 917, a connector 920, an organic substrate 930, a PIC die 940, and an optical bench 960 with an inlet 964, fiber array unit 966, outlet 967, prism 968, and lens 969.

In assembly 900, the organic substrate 930 can include a cutout to enable active optical alignment of the fiber array unit 966 to the PIC die 940. The connector 920 can be electrically attached to the test board 915 on an optical assembly tool to enable this active alignment.

Figure 10:
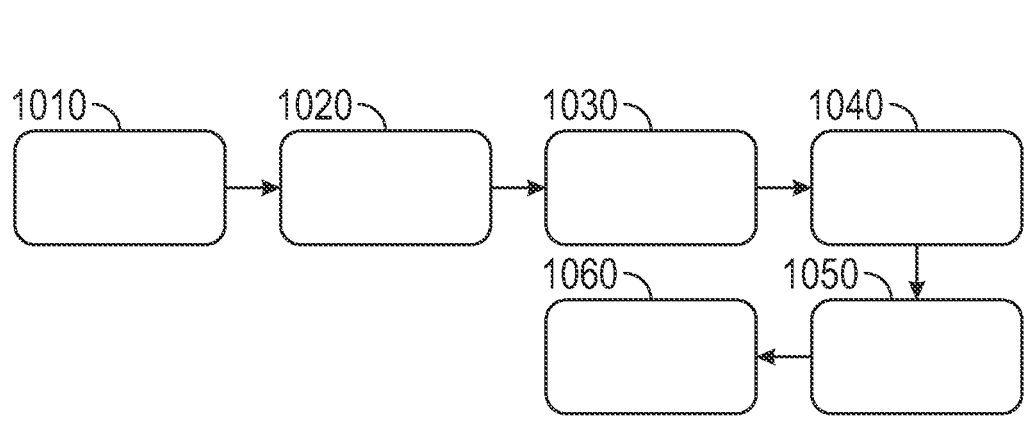
FIG. 10 depicts a flow chart illustrating a method of making a PIC and EIC architecture with an organic substrate interposer in an example.

FIG. 10 depicts a flow chart illustrating a method 1000 of making a PIC and EIC architecture with an organic substrate interposer, such as the example discussed with reference to FIGS. 8 and 9, in an example.

In method 1000, the PIC die can be attached to the organic substrate (block 1010). The EIC dice and the connector can then be attached to the organic substrate on an opposing side from the PIC die (block 1020). Both the PIC die and the EIC dice can be attached through a flip chip assembly process. The optical bench (which can serve as a chassis) can be attached to the PIC die, the EIC dice, and a substrate sub-module (block 1030).

The fiber array unit can be attached to the optical bench and actively aligned to the PIC die (block 1040). A heat spreader can be attached to the EIC dice to enable a secondary thermal path to the top of the assembly (block 1050). The assembly can then be attached to a LiDAR System board, such as through a metallic shroud (block 1060).

Figure 11:
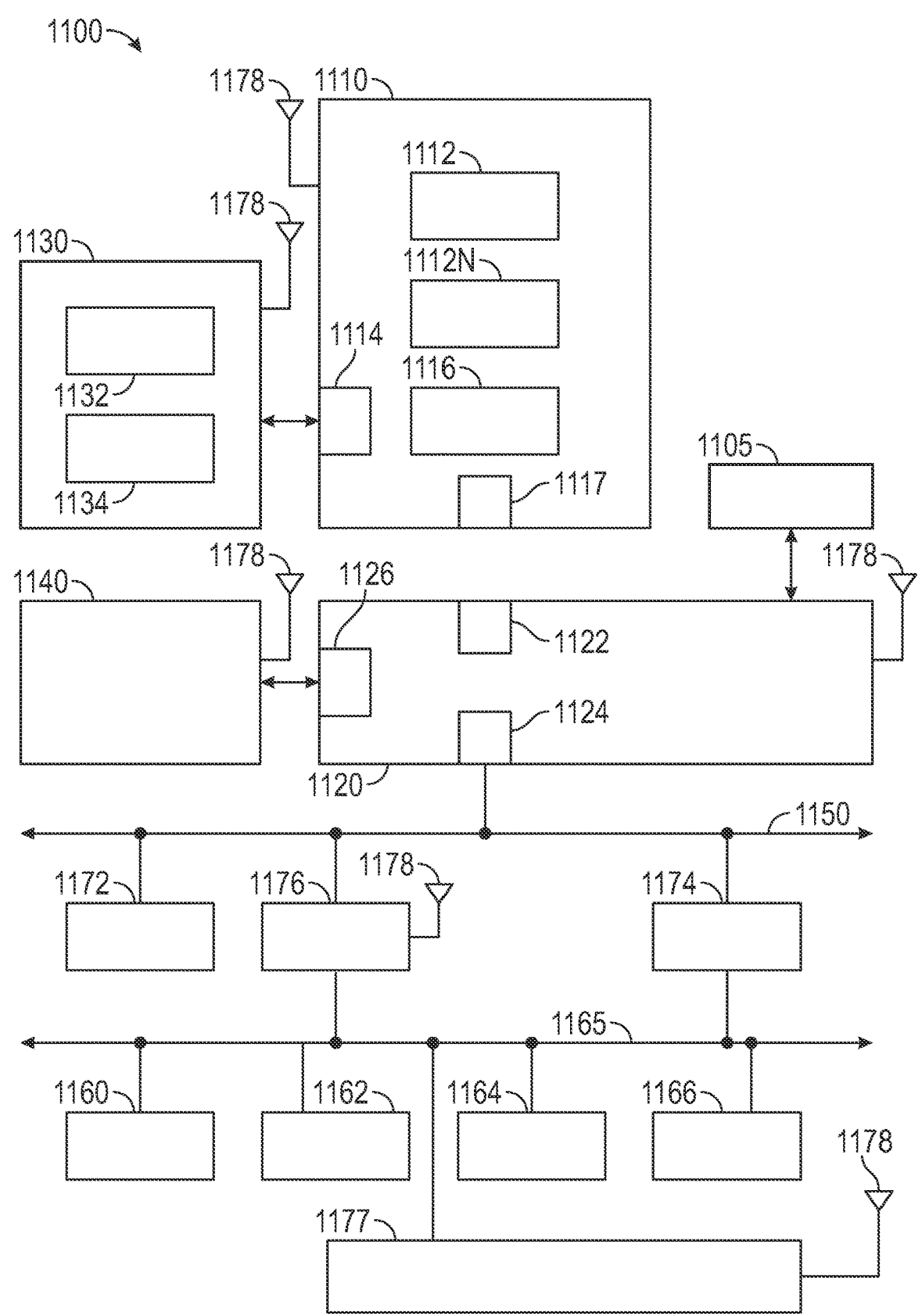
FIG. 11 illustrates an example system level diagram.

FIG. 11 illustrates a system level diagram, depicting an example of an electronic device (e.g., system) that may include a photonic assembly and/or methods described above. In one embodiment, system 1100 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance, or any other type of computing device. In some embodiments, system 1100 includes a system on a chip (SOC) system.

In one embodiment, processor 1110 has one or more processor cores 1112 and 1112N, where 1112N represents the Nth processor core inside processor 1110 where N is a positive integer. In one embodiment, system 1100 includes multiple processors including 1110 and 1105, where processor 1105 has logic similar or identical to the logic of processor 1110. In some embodiments, processing core 1112 includes, but is not limited to, pre-fetch logic to fetch instructions, decode logic to decode the instructions, execution logic to execute instructions and the like. In some embodiments, processor 1110 has a cache memory 1116 to cache instructions and/or data for system 1100, Cache memory 1116 may be organized into a hierarchal structure including one or more levels of cache memory.

In some embodiments, processor 1110 includes a memory controller 1114, which is operable to perform functions that enable the processor 1110 to access and communicate with memory 1130 that includes a volatile memory 1132 and/or a non-volatile memory 1134. In some embodiments, processor 1110 is coupled with memory 1130 and chipset 1120. Processor 1110 may also be coupled to a wireless antenna 1178 to communicate with any device configured to transmit and/or receive wireless signals. In one embodiment, an interface for wireless antenna 1178 operates in accordance with, but is not limited to, the IEEE 802.11 standard and its related family, Home Plug AV (HPAV), Ultra-Wide Band (UWB), Bluetooth, WiMAX, or any form of wireless communication protocol.

In some embodiments, volatile memory 1132 includes, but is not limited to, Synchronous Dynamic Random-Access Memory (SDRAM), Dynamic Random-Access Memory (DRAM), RAMBUS Dynamic Random-Access Memory (RDRAM), and/or any other type of random-access memory device. Non-volatile memory 1134 includes, but is not limited to, flash memory, phase change memory (PCM), read-only memory (ROM), electrically erasable programmable read-only memory (EEPROM), or any other type of non-volatile memory device.

Memory 1130 stores information and instructions to be executed by processor 1110. In one embodiment, memory 1130 may also store temporary variables or other intermediate information while processor 1110 is executing instructions. In the illustrated embodiment, chipset 1120 connects with processor 1110 via Point-to-Point (PtP or P-P) interfaces 1117 and 1122. Chipset 1120 enables processor 1110 to connect to other elements in system 1100. In some embodiments of the example system, interfaces 1117 and 1122 operate in accordance with a PtP communication protocol such as the Intel® Quick Path Interconnect (QPI) or the like. In other embodiments, a different interconnect may be used.

In some embodiments, chipset 1120 is operable to communicate with processor 1110, 1105N, display device 1140, and other devices, including a bus bridge 1172, a smart TV 1176, I/O devices 1174, nonvolatile memory 1160, a storage medium (such as one or more mass storage devices) 1162, a keyboard/mouse 1164, a network interface 1166, and various forms of consumer electronics 1177 (such as a PDA, smart phone, tablet etc.), etc. In one embodiment, chipset 1120 couples with these devices through an interface 1124. Chipset 1120 may also be coupled to a wireless antenna 1178 to communicate with any device configured to transmit and/or receive wireless signals. In one example, any combination of components in a chipset may be separated by a continuous flexible shield as described in the present disclosure.

Chipset 1120 connects to display device 1140 via interface 1126. Display 1140 may be, for example, a liquid crystal display (LCD), a light emitting diode (LED) array, an organic light emitting diode (OLED) array, or any other form of visual display device. In some embodiments of the example system, processor 1110 and chipset 1120 are merged into a single SOC. In addition, chipset 1120 connects to one or more buses 1150 and 1155 that interconnect various system elements, such as I/O devices 1174, non-volatile memory 1160, storage medium 1162, a keyboard/mouse 1164, and network interface 1166. Buses 1150 and 1155 may be interconnected together via a bus bridge 1172.

In one embodiment, mass storage device 1162 includes, but is not limited to, a solid-state drive, a hard disk drive, a universal serial bus flash memory drive, or any other form of computer data storage medium. In one embodiment, network interface 1166 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra-Wide Band (UWB), Bluetooth, WiMAX, or any form of wireless communication protocol.

While the modules shown in FIG. 11 are depicted as separate blocks within the system 1100, the functions performed by some of these blocks may be integrated within a single semiconductor circuit or may be implemented using two or more separate integrated circuits. For example, although cache memory 1116 is depicted as a separate block within processor 1110, cache memory 1116 (or selected aspects of 1116) can be incorporated into processor core 1112.

Various Notes & Examples

Each of these non-limiting examples can stand on its own, or can be combined in various permutations or combinations with one or more of the other examples.

Example 1 is a semiconductor assembly comprising: a printed circuit board; an organic substrate interposer surface mounted to the printed circuit board, the organic substrate interposer having a first side and a second side opposite each other; an electronic integrated circuit die attached to the organic substrate on the first side; and a photonic integrated circuit die attached to the organic substrate on the second side, wherein the electronic integrated circuit die, and the photonic integrated circuit die are electrically coupled to each other through the organic substrate interposer.

In Example 2, the subject matter of Example 1 optionally includes wherein the electronic integrated circuit die, and the photonic integrated circuit die are each attached to the organic substrate interposer through a flip chip and underfill assembly.

In Example 3, the subject matter of any one or more of Examples 1-2 optionally include a chassis, wherein the printed circuit board is mounted on the chassis opposite the organic substrate interposer.

In Example 4, the subject matter of Example 3 optionally includes a spacing insert mounted on the chassis, wherein the photonic integrated circuit die is mounted on the spacing insert opposing the organic substrate interposer.

In Example 5, the subject matter of any one or more of Examples 1-4 optionally include a heat spreader mounted on the electronic integrated circuit die opposite the organic substrate interposer.

In Example 6, the subject matter of any one or more of Examples 1-5 optionally include a system connector mounted on the printed circuit board.

Example 7 is a method of making a semiconductor assembly comprises: attaching a photonic integrated circuit die to a first side of an organic substrate interposer; attaching an electronic integrated circuit die to a second side of the organic substrate interposer, wherein the second side is opposite the first side; surface mounting the organic substrate interposer to a printed circuit board; and attaching photonic integrated circuit die to a spacing insert.

In Example 8, the subject matter of Example 7 optionally includes surface mounting a system connector to the printed circuit board.

In Example 9, the subject matter of any one or more of Examples 7-8 optionally include attaching the printed circuit board to a chassis and attaching the spacing insert to the chassis.

Example 10 is a semiconductor assembly comprising: a system board; an interconnect array interposer; an organic substrate comprising a flip chip land grid array; an electronic integrated circuit die electrically coupled to the system board through the organic substrate and the interconnect array interposer; a photonic integrated circuit die, wherein the organic substrate and the interconnect array interposer electrically couple the photonics module to the system board; an optical bench configured to allow optical connection to the photonics module; and a shroud at least partially enclosing the interposer, the organic substrate, and the photonics module.

In Example 11, the subject matter of Example 10 optionally includes wherein the interconnect array interposer comprises a glass-reinforced epoxy laminate material.

In Example 12, the subject matter of any one or more of Examples 10-11 optionally include wherein the organic substrate comprises a cutout.

In Example 13, the subject matter of any one or more of Examples 10-12 optionally include wherein the optical bench comprises an invar optical bench.

In Example 14, the subject matter of any one or more of Examples 10-13 optionally include wherein the optical bench comprises an input for a fiber array unit and an output for a prism.

In Example 15, the subject matter of any one or more of Examples 10-14 optionally include wherein the electronic integrated circuit die comprises a transimpedance amplifier mounted on the optical bench, the transimpedance amplifier coupled to the system board through the organic substrate and the interconnect array interposer.

In Example 16, the subject matter of any one or more of Examples 10-15 optionally include a cold plate coupled to the optical bench opposite the photonics module.

Example 17 is a method of making a semiconductor assembly, comprising: attaching a photonics integrated circuit die and an electronics integrated circuit die to an organic substrate; surface mounting a pin array interposer to the organic substrate opposite the photonics module; securing the photonics integrated circuit die, the electronics integrated circuit die, and the pin array interposer to an optical bench; and attaching a system board to the pin array interposer opposite the organic substrate.

In Example 18, the subject matter of Example 17 optionally includes securing a fiber array unit to the optical bench.

In Example 19, the subject matter of any one or more of Examples 17-18 optionally include aligning the photonics integrated circuit die within the optical bench.

In Example 20, the subject matter of any one or more of Examples 17-19 optionally include wherein attaching the photonics integrated circuit die and the electronics integrated circuit die comprises attaching the photonics integrated circuit die and the electronics integrated circuit die to opposing sides of the organic substrate.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAM), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A Light Detection and Ranging (LiDAR) assembly comprising:
   a system circuit board;
   an interconnect array interposer electrically coupled to the system circuit board;
   an organic substrate comprising a flip chip land grid array, the organic substrate electrically coupled to the interconnect array interposer with interconnects proximal to a periphery of the organic substrate;
   an electronic integrated circuit (EIC) die electrically coupled to the system circuit board through the flip chip land grid array on a first side of the organic substrate;
   a photonic integrated circuit (PIC) die coupled to a second side of the organic substrate, opposite the EIC die, wherein the organic substrate electrically couples the PIC die to the EIC die and couples the PIC die and EIC die to the system circuit board through the interconnect array interposer;
   an optical bench to allow optical connection to the photonic integrated circuit die; and
   a shroud at least partially enclosing the interposer, the organic substrate, and the photonic integrated circuit die, wherein the organic substrate comprises a ground plane that is continuous from the PIC to the EIC.

2. The LiDAR assembly of claim 1, wherein the interconnect array interposer comprises a glass-reinforced epoxy laminate material.

3. The assembly of claim 2, wherein the electronic integrated circuit die, and the photonic integrated circuit die are each attached to the interposer in a flip chip assembly.

4. The assembly of claim 2, further comprising a heat spreader mounted on the electronic integrated circuit die opposite the interposer.

5. The LiDAR assembly of claim 1, wherein the organic substrate comprises a cutout to align a fiber array unit to the photonic integrated circuit die.

6. The LiDAR assembly of claim 1, further comprising a system connector to couple the system circuit board with a host system, and wherein the ground plane is continuous to the system connector.

7. The LiDAR assembly of claim 1, wherein the optical bench comprises an input for a fiber array unit and an output for a prism or waveguide.

8. The LiDAR assembly of claim 1, wherein the electronic integrated circuit die comprises a transimpedance amplifier, the transimpedance amplifier coupled to the system circuit board through the organic substrate and the interconnect array interposer.

9. The LiDAR assembly of claim 1, further comprising a cold plate coupled to the optical bench opposite the PIC.

* * * * *